(12) United States Patent
Nishihata et al.

(10) Patent No.: US 7,534,728 B2
(45) Date of Patent: May 19, 2009

(54) PROCESS FOR CLEANING SILICON SUBSTRATE

(75) Inventors: Hideki Nishihata, Tokyo (JP); Tatsumi Kusaba, Tokyo (JP); Nobuyuki Morimoto, Tokyo (JP)

(73) Assignee: Sumco Corporation, Tokyo (JP)

( * ) Notice: Subject to any disclaimer, the term of this patent is extended or adjusted under 35 U.S.C. 154(b) by 191 days.

(21) Appl. No.: 11/403,410

(22) Filed: Apr. 12, 2006

(65) Prior Publication Data

US 2006/0234461 A1   Oct. 19, 2006

(30) Foreign Application Priority Data

Apr. 19, 2005   (JP) .............................. 2005-121005

(51) Int. Cl.
*H01L 21/461* (2006.01)
(52) U.S. Cl. ...................................... 438/749
(58) Field of Classification Search ................ 438/471, 438/475, 747–750, 906, 963; 257/E21.568
See application file for complete search history.

(56) References Cited

U.S. PATENT DOCUMENTS

| | | | | |
|---|---|---|---|---|
| 5,354,698 | A * | 10/1994 | Cathey, Jr. ................. | 438/514 |
| 6,534,381 | B2 * | 3/2003 | Cheung et al. .............. | 438/455 |
| 6,900,113 | B2 * | 5/2005 | Nakano et al. .............. | 438/455 |
| 6,959,854 | B2 | 11/2005 | Yokokawa et al. | |
| 7,235,812 | B2 * | 6/2007 | Chu et al. .................... | 257/65 |
| 2005/0115671 | A1 * | 6/2005 | Araki ..................... | 156/345.12 |

FOREIGN PATENT DOCUMENTS

| | | |
|---|---|---|
| JP | 2003-309101 | 10/2003 |
| KR | 1998-077553 | 11/1998 |
| WO | WO 01/93334 A1 | 12/2001 |

OTHER PUBLICATIONS

Korean Office Action issued in connection with Korean Patent Application No. 10-2006-0034633, Mar. 23, 2007.
English language translation of Korean Office Action issued in connection with Korean Patent Application No. 10-2006-0034633, Mar. 23, 2007.
Office Action from the Korean Intellectual Property Office issued on Korean Patent Application No. 10-2006-0034633.

* cited by examiner

*Primary Examiner*—Calvin Lee
(74) *Attorney, Agent, or Firm*—Kolisch Hartwell, PC (57) ABSTRACT

In the production process of an SOI substrate using a hydrogen ion implantation method, a process is provided for cleaning the substrate which can prevent formation of voids when bonding substrates and formation of blistering after exfoliation. In the process for cleaning, cleaning of the substrate is performed before performing hydrogen ion implantation. As the cleaning method, one or more of a combination selected from the group consisting of SC-1 cleaning, SC-1 cleaning+ SC-2 cleaning, HF/$O_3$ cleaning, and HF cleaning+$O_3$ cleaning, can be used.

6 Claims, 6 Drawing Sheets

PROCESS FOR CLEANING SILICON SUBSTRATE

BACKGROUND OF THE INVENTION

1. Field of the Invention

The present invention relates to a process for cleaning a silicon substrate which is bonded by hydrogen ion implantation method, in particular a process for cleaning a silicon substrate, which is a raw material, before being bonded.

Priority is claimed on Japanese Patent Application No. 2005-121005, filed Apr. 19, 2005, the content of which is incorporated herein by reference.

2. Description of the Related Art

Silicon On Insulator(SOI) substrates, which are formed by bonding silicon substrates to each other in which hydrogen ions are implanted, is attracting attention as semiconductor substrates for use in next-generation very large-scale integrated circuits i.e. VLSI, because SOI substrate demonstrate various excellent characteristics, such as high speed, low power consumption, operability at high temperature, and radiation-resistant effect, in the case in which integrated circuits are formed using SOI substrates.

Figure 4:
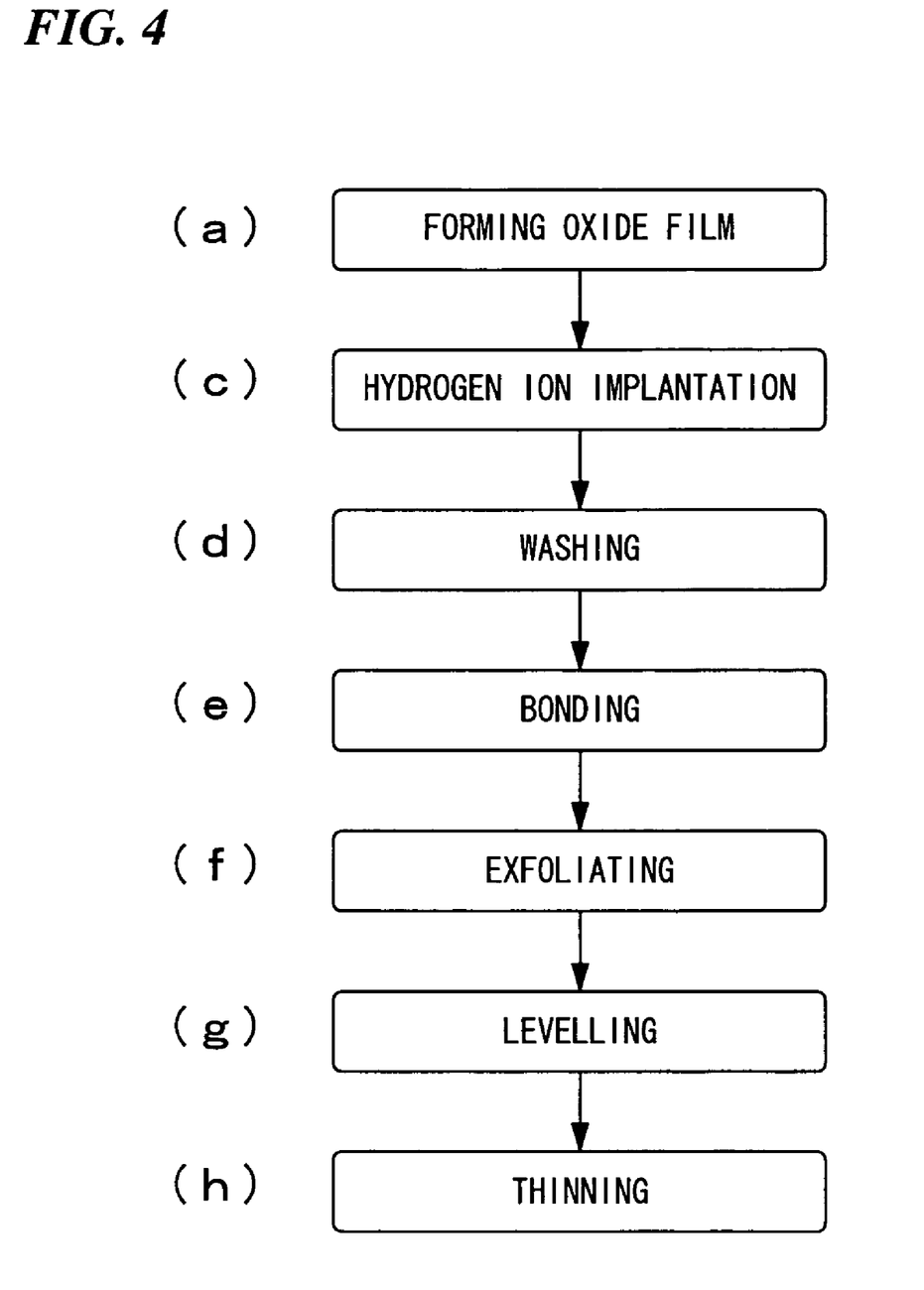
FIG. 4 is a flow chart showing the outline of the production process of conventional SOI substrate.

Hitherto, as the process for producing SOI substrates, a process is known, as shown in FIG. 4, which includes (a) forming an oxide film on a first silicon substrate surface, using a thermal oxidation method, etc., (c) implanting hydrogen ions in the surface of the substrate so as to form a fine bubble layer, i.e. an implanted layer, within the substrate, (d) cleaning the substrate in which hydrogen ions are implanted, (e) bonding the first silicon substrate to a second silicon substrate, (f) exfoliating the two substrates from each other while making the fine bubble layer be a divide line, (g) leveling the fine bubble layer on the surface of the first silicon substrate which exists on the exfoliated second silicon substrate, while intervening an oxide film therebetween, and (h) thinning the first silicon substrate into a predetermined thickness by processing such as grinding, as is disclosed in patent document 1 (i.e. International Publication No. 01-093334, pamphlet).

In the method disclosed in patent document 1, cleaning is performed after performing ion implantation in order to remove the particles on the silicon substrate. Moreover, as the cleaning method, cleaning (SC-1 cleaning) using a mixed solution containing $NH_4OH$, $H_2O_2$, and $H_2O$ is disclosed.

Furthermore, as a method of performing the substrate-cleaning and the hydrogen ion implantation, dividing each of the substrate-cleaning and the hydrogen ion implantation into several steps, is also proposed, as is disclosed in patent document 2(i.e. Japanese Unexamined Patent Application, First Publication No. 2003-309101 official report). As the cleaning method, cleaning using ammonia, hydrogen peroxide, pure water, electrolysis ion water, a mixed-solution (SC-1) containing $NH_4OH$, $H_2O_2$, and $H_2O$, etc. is disclosed. In accordance with this method, it is possible to reduce the generation of a portion which is formed right under a particle and becomes a shadow of ion-implantation, thereby causing generation of voids, in addition, it is also possible to reduce the area in which the hydrogen ion concentration is significantly low so as to eliminate exfoliation fault after heat treatment, thereby preventing the formation of voids.

Although these ion implantation exfoliating methods are excellent as a method for producing a bonded SOI substrate, it is necessary to decrease miss-bonding, known as a void, which is generated at an interface of adhering two substrates, in order to produce these SOI substrates with high yield at a mass-production level. It has turned out that the particles adhered on the surface mainly cause voids, and it turns out that if the particle size of the particles is 0.5 µm or more, then voids will be generated.

Figure 5:
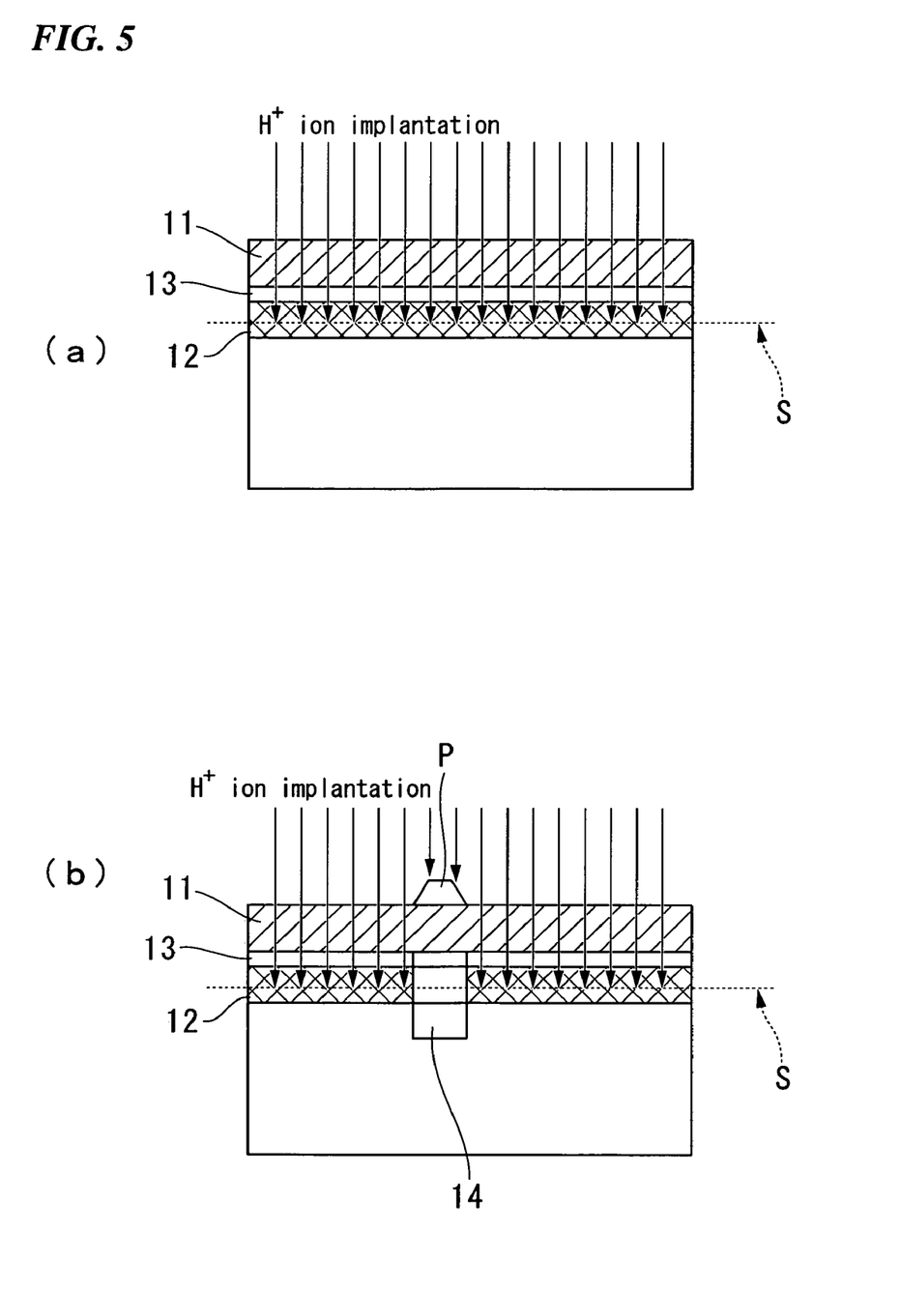
FIG. 5A is a figure showing the influence of the particles when performing ion implantation, in the case in which there are no particles.
FIG. 5B is a figure showing the influence of the particles when performing ion implantation, in the case in which there are particles which are adhered.

In the case in which no particles are adhered when performing ion implantation, as shown in FIG. 5(a), a hydrogen ion-implanted layer 12, in which hydrogen ions are implanted uniformly throughout an area which becomes an active silicon layer 13 later, will be formed beneath an oxide film 11. If such a uniform hydrogen ion-implanted layer 12 is formed, then it is possible to exfoliate clearly, at an exfoliated surface S that is brittle, within the hydrogen ion-implanted layer 12, during the exfoliating step.

On the other hand, in the case in which particles are adhered when performing ion implantation, part of a particle P will not be adhered during an adhering step, as shown in FIG. 5(b), in addition, the portion under the particle P becomes shadow of the particle P so that a predetermined quantity of hydrogen ions will not be implanted thereto, thereby generating a hydrogen ion depletion area 14. If the hydrogen ion depletion area 14 is generated, then this portion does not become brittle, and as a result, no continuous exfoliated surface S will be obtained during the exfoliating step, thereby it becomes impossible to exfoliate clearly.

Therefore, in order to reduce such a void, it is necessary to perform substrate cleaning to completely remove the particles adhered to the silicon substrate surface on which ion implantation will be performed, before performing ion implantation.

If hydrogen ion implantation is performed in steps and cleaning between ion implantation is performed, then it is possible to remove particles to a certain degree, however, most of the particles which entered before performing ion implantation will be fixed to the surface of the substrate by performing ion implantation, so that it becomes impossible to remove the particles by cleaning with a chemical fluid. Moreover, if cleaning between ion implantation is performed, then the surface of the silicon substrate on which ion implantation is performed becomes coarser than that of an ordinary substrate due to the cleaning, and since cleaning is repeated plural times, roughening of the silicon substrate surface will progress, thereby generating voids etc., when bonding the substrates. In addition, if ion implantation is performed in steps while inserting cleaning steps therebetween, then the number of steps during production increases, thereby making it complex, and as a result, productivity will deteriorate remarkably.

Thus, it is an object of the present invention to eliminate particles on the surface of the substrate, which cause a shadow when performing ion implantation and voids when bonding substrates with each other, and provide an effective cleaning method without increasing the number of production steps.

SUMMARY OF THE INVENTION

In order to solve the above problem, the present invention has adopted the following constitution, that is, a first aspect of the present invention is a process for cleaning a bonded SOI silicon substrate using hydrogen ion implantation, including: cleaning a silicon substrate, and then performing hydrogen ion implantation on said silicon substrate.

In the process of the first aspect of the present invention above, the cleaning may be performed two or more times, while changing the cleaning condition.

In the process of the first aspect of the present invention above, the cleaning may be one or more of a combination selected from the group consisting of SC-1 cleaning, SC-1 cleaning+SC-2 cleaning, HF/$O_3$ cleaning, or HF cleaning+$O_3$ cleaning.

In the process of the first aspect of the present invention above, the cleaning may be performed again after performing the hydrogen ion implantation.

In the process of the first aspect of the present invention in the above, the cleaning performed after performing the hydrogen ion implantation may be rinsing with ultrapure water.

In the process of the first aspect of the present invention above, it is preferable to perform the cleaning until the bonded SOI silicon substrate after the cleaning has a surface roughness expressed in terms of an RMS value of not more than 0.1 nm (10 μm×10 μm).

DETAILED DESCRIPTION OF THE INVENTION

Figure 1:
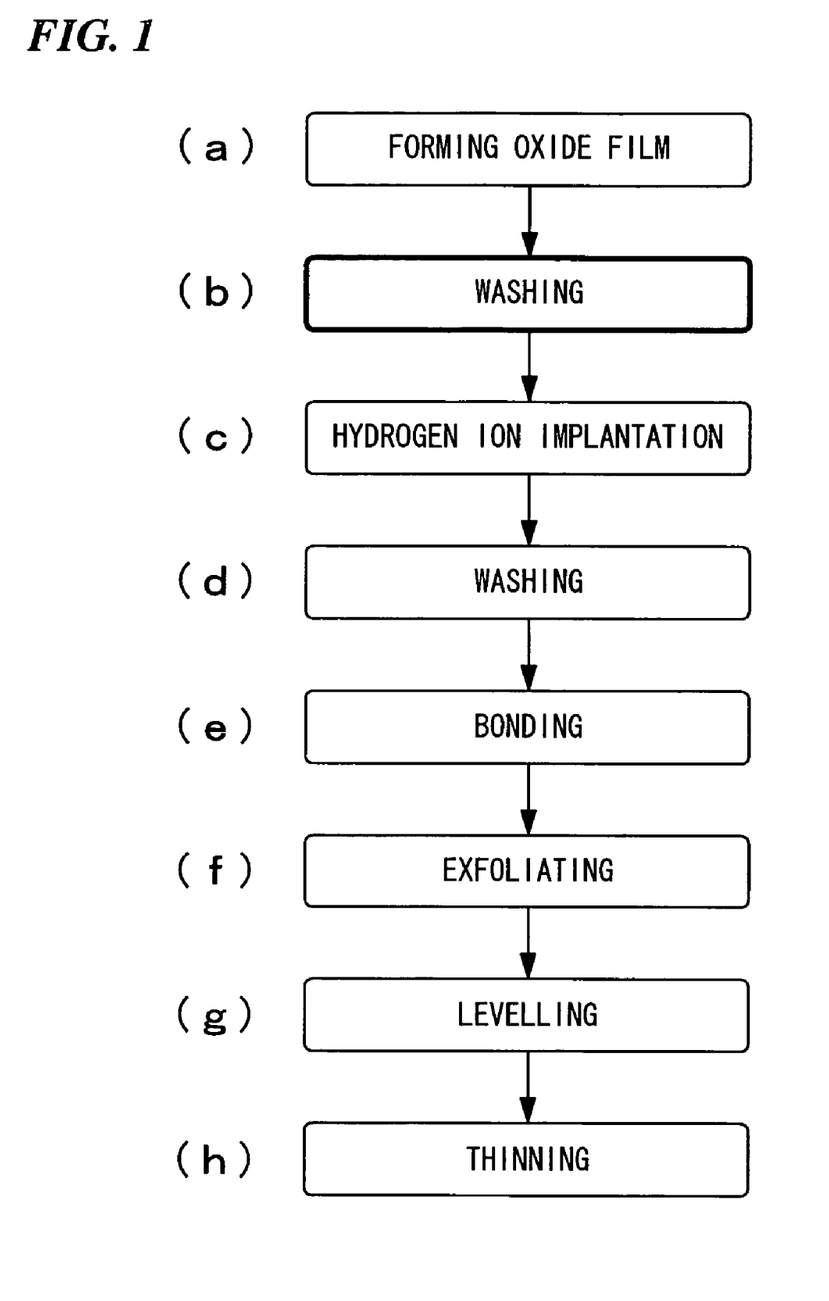
FIG. 1 is a flow chart showing the outline of the SOI substrate production process of the present invention.

An outline of the production process of an SOI substrate using the process for cleaning a silicon substrate of the present invention is shown in FIG. 1. This production process of an SOI substrate includes (a) an oxide film forming step of forming an oxide film on a first silicon substrate surface by a thermal oxidation method, etc., (b) a cleaning step of cleaning the silicon substrate on which the oxide film is formed, (c) a hydrogen ion implanting step of implanting hydrogen ions on the surface of the silicon substrate to form a fine bubble layer (i.e. implanted layer) within the substrate, (d) cleaning again the silicon substrate into which hydrogen ions are implanted, (e) a bonding step of bonding the substrate into which hydrogen ions are implanted to the surface of a second silicon substrate, (f) an exfoliating step of exfoliating the two bonded substrates from each other at the interface where the fine bubble layer is laid, (g) a leveling step of leveling the fine bubble layer on the surface of the first silicon substrate, which is disposed onto the exfoliated second silicon substrate while inserting an oxide film therebetween, and (h) a thinning step of thinning the first silicon layer which is disposed onto the second silicon substrate while inserting the oxide film therebetween at a predetermined thickness, thereby producing an SOI substrate.

The outline of the processing in each step will be explained with referring to FIGS. 2 and 3.

Figure 2:
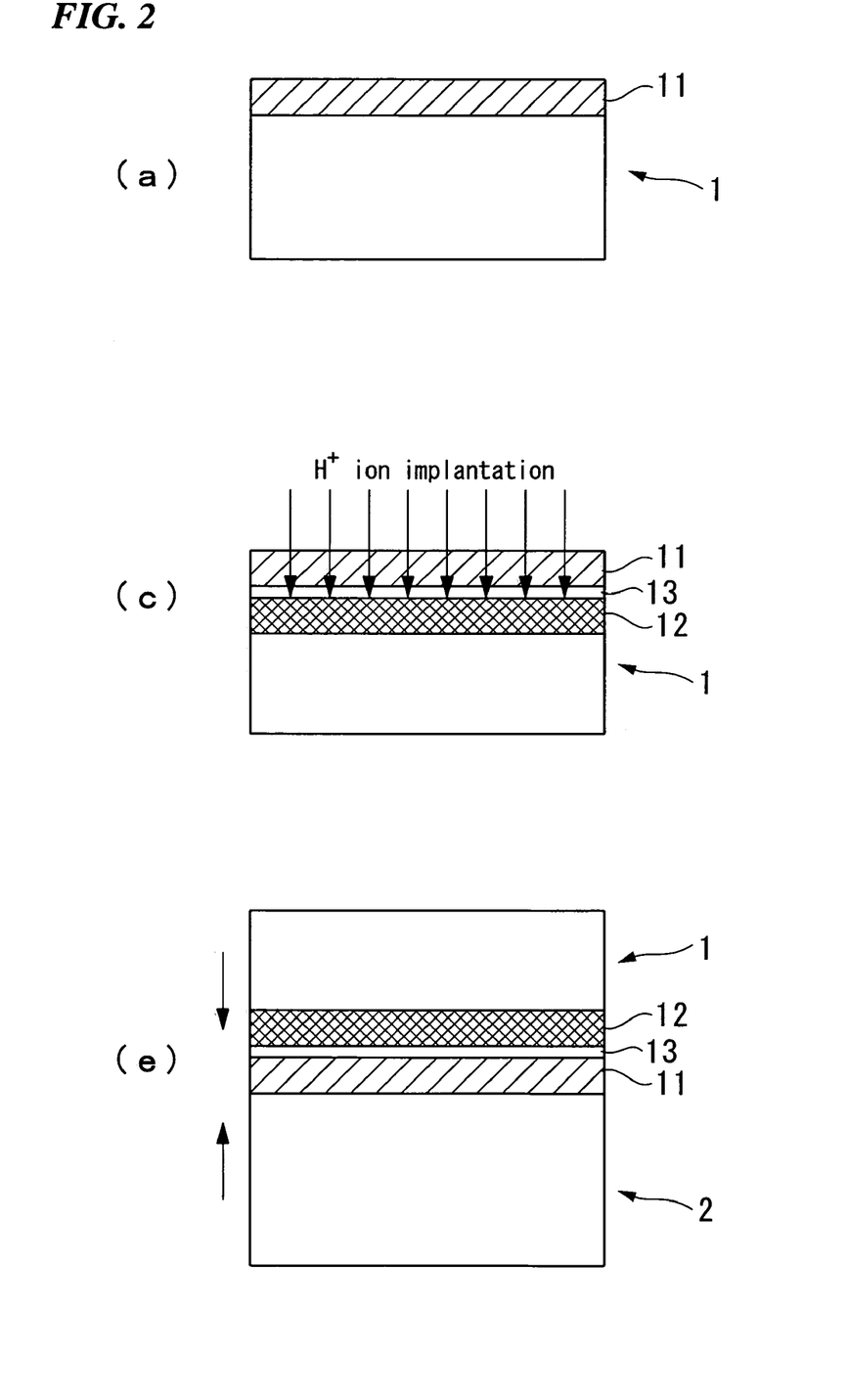
FIG. 2 is a figure showing the outline of the processing in each step in FIG. 1.
Figure 3:
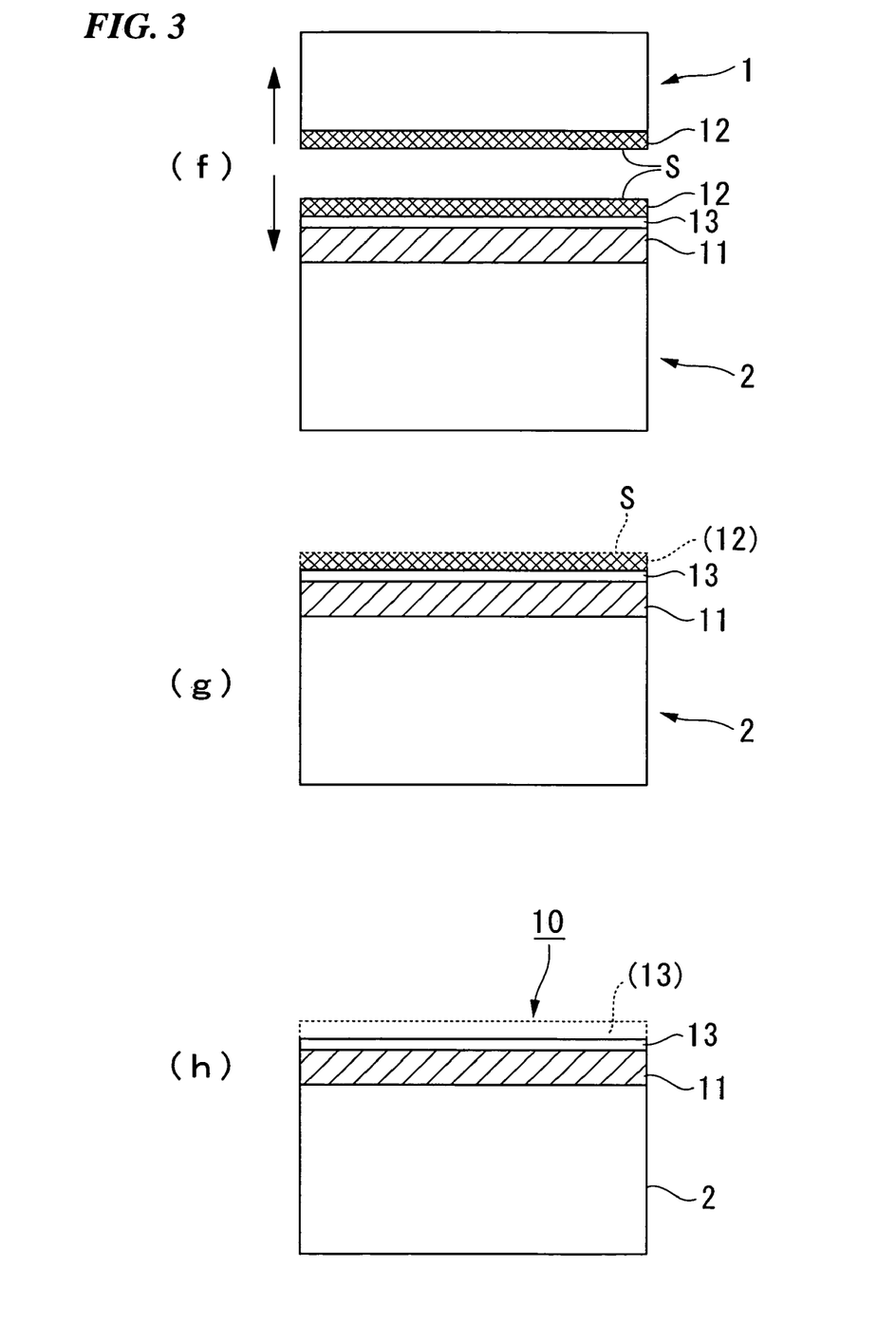
FIG. 3 is a figure showing the outline of the processing in each step following FIG. 2.

First, as shown in FIG. 2, part (a), an oxide film 11 is formed on the surface of a first silicon substrate (top wafer) 1 by a thermal oxidation method, CVD, etc. The oxide film 11 preferably has a thickness of approximately 100 to 300 nm.

If a single-crystal silicon substrate is used as the first silicon substrate 1, then it is possible to produce an SOI substrate having an SOI layer of which the thickness is very uniform, at low cost, and hence it can be widely applied to various devices. Moreover, a single-crystal silicon substrate is applicable for increasing the diameter of the substrate.

If the oxide film 11 is formed, then it is possible to prevent deterioration of an implantation profile due to a channeling phenomenon in the next ion implantation, thereby decreasing generation of voids when bonding to a second silicon substrate 2.

Next, the first silicon substrate 1 on which the oxide film 11 is formed will be cleaned before performing ion implantation.

Since the cleaning method is the most characteristic part, it will be explained in detail later again.

Subsequently, as is shown in FIG. 2, part (c), $2\times10^{16}$/cm$^2$ to $1\times10^{17}$/cm$^2$ of hydrogen ions are implanted on the surface of the oxide film 11. Then, under the oxide film 11, a hydrogen ion-implanted layer 12 is formed at a desired depth, while inserting therebetween an area which later becomes an active silicon layer 13. Thickness of the active silicon layer 13 will be determined by the depth of the hydrogen ion-implanted layer 12, which is determined by the energy applied when performing ion implantation. The hydrogen ion implanted layer 12 contains a large number of fine bubbles, and hence the hydrogen ion-implanted layer 12 is so brittle that the hydrogen ion-implanted layer 12 will become an exfoliated surface S in the subsequent exfoliating step.

Next, after hydrogen ion implantation is finished, the first silicon substrate will be cleaned again. This cleaning method will be explained later.

Next, after cleaning, the first silicon substrate 1 and the second silicon substrate are stacked and bonded to each other. As the second silicon substrate 2 (i.e. base wafer), it is possible to use a single-crystal silicon substrate with a surface on which mirror finishing has been performed similarly.

If a single-crystal silicon substrate is used as the second silicon substrate 2, then a substrate which excels in flatness can be obtained, in addition, it is possible to obtain a substrate having a large diameter of 200 mm, 300 mm or larger.

In the bonding step, as shown in FIG. 2, part (e), the first silicon substrate 1 is turned upside-down so that the oxide film 11 side faces down, and then stacked onto the surface of the second silicon substrate 2, which has been subjected to a mirror finishing at room temperature. And the bonded substrate is subjected to annealing at a temperature of 500 to 1000° C. under oxygen environment to exfoliate.

By this heat treatment, the hydrogen ion-implanted layer 12 becomes brittle, while making the fine bubble layer an interface, and as a result, it becomes possible to exfoliate the bonded substrate, while making the hydrogen ion-implanted layer 12 an exfoliating surface S in the exfoliating step shown in FIG. 2, part (f).

On the exfoliated surface of the second silicon substrate (base wafer) 2 thus obtained, which has a thin hydrogen ion-implanted layer 12 on the surface, an unevenness of approximately 10 nm is formed. For this reason, the surface is leveled (see FIG. 2, part (g)) using a machine grinding method and a chemical-polishing method if necessary.

Finally, as shown in FIG. 2, part (h), the remaining hydrogen ion-implanted layer 12 and a part of the active silicon layer 13 are subjected to a processing such as polishing-removal etc., to obtain an SOI substrate having a desired thickness.

Here, a cleaning step shown in FIG. 1, part (b) will be explained again. In the present invention, the first silicon substrate before hydrogen ion implantation is cleaned. Cleaning is for removing particles adhered to the silicon substrate surface to which hydrogen ion implantation is performed. If ion implantation is performed with particles adhered, then particles will be fixed, so that it becomes impossible to remove the particles after the ion implantation, and hence cleaning is performed.

As the cleaning method, one of or a combination of two or more of SC-1 cleaning, SC-1 cleaning+SC-2 cleaning, HF/$O_3$ cleaning, and HF cleaning+$O_3$ cleaning can be employed.

Here, SC-1 cleaning is a cleaning method which uses a mixed-solution containing $NH_4OH$, $H_2O_2$ and $H_2O$, SC-2 cleaning is a cleaning method which uses a mixed-solution containing HCl, $H_2O_2$ and $H_2OH$, HF/$O_3$ cleaning is a cleaning method which uses a solution in which ozone ($O_3$) is dissolved in an aqueous HF solution, and HF cleaning+$O_3$ cleaning is a cleaning method which performs cleaning using an aqueous solution in which ozone ($O_3$) is dissolved after performing cleaning with an aqueous HF solution.

In general, an SC-1 cleaning solution may have a concentration ratio of $NH_4OH$ (29 wt %): $H_2O_2$(30 wt %): $H_2O$=1:1:5 to 1:1:10.

In general, an SC-2 cleaning solution may have concentration ratio of HCl (30 wt %):$H_2O_2$(30 wt %): $H_2O$=1:1:5 to 1:1:10.

An HF/$O_3$ cleaning solution may be a solution in which 0.1% of $O_3$(ozone) is dissolved in an aqueous solution of 0.1% HF.

An $O_3$ cleaning solution may be an aqueous solution in which 0.1% of $O_3$(ozone) is dissolved in ultrapure water.

The cleaning method of the present invention adopts the method of cleaning the silicon substrate before performing hydrogen ion implantation thereon using any one of or a combination of two or more of the above-mentioned cleaning methods.

In particular, $O_3$ cleaning has an effect of recovering the roughness of the surface of silicon substrate which is roughened by cleaning.

If a silicon substrate is cleaned in an aqueous solution containing hydrogen peroxide or hydrogen fluoride, then the surface roughness on the surface of the substrate will deteriorate, so that an area which is not exfoliated at a boundary of the ion-implanted layer, i.e. which is exfoliated at the bonded interface (void) will be generated, when performing bonding and exfoliating thereafter.

Hitherto, there was no recovery means once surface roughness has deteriorated, and hence it was necessary to prevent the surface of the substrate from being roughened by severely controlling temperature and cleaning time. In such a case, the surface roughness can be recovered by performing $O_3$ cleaning. Therefore, as for $O_3$ cleaning, it is effective to perform successively after SC-1 cleaning and HF cleaning.

Figure 6:
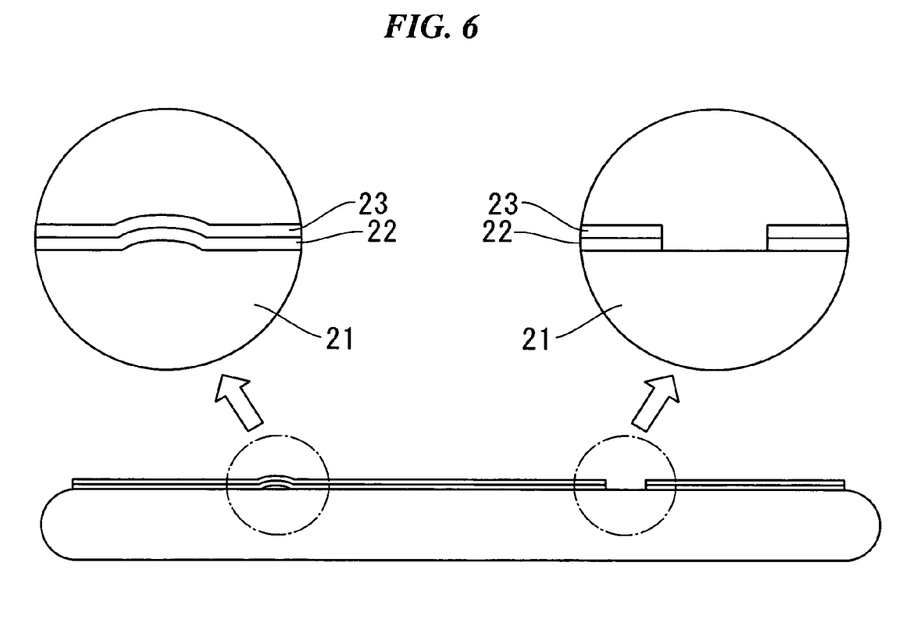
FIG. 6 is a figure showing a failure state.

As for the surface roughness of the silicon substrate surface after cleaning, it is preferable to be not more than 0.1 nm expressed in terms of RMS value. If the surface roughness of the silicon substrate surface after cleaning exceeds 0.1 nm, then a blistering fault (i.e., a heat-bump like fault in which both a BOX layer 22 and an SOI layer 23 exist on a support side wafer 21, thereby generating a space at the interface of bonding. See FIG. 6, part (a)) and void fault (i.e., a fault in which both the BOX layer 22 and SOI layer 23 do not exist, thereby exposing the support side wafer 21. See FIG. 6, part (b)) which generate when bonding and exfoliating as shown in FIG. 6, will increase.

It becomes possible to prevent voids from generating when bonding, if the particles which has been adhered to the surface are removed perfectly before performing hydrogen ion implantation after making the surface roughness of the silicon substrate uniform.

Performing cleaning like the above is not limited to once, for example, it is also possible to perform cleaning in steps, while changing the concentration of the cleaning solution, cleaning time, etc.

Moreover, as shown in FIG. 1, part (d), it is effective to clean a silicon substrate again after performing hydrogen ion implantation, for preventing the generation of voids.

The cleaning method in particular is not limited and it is possible to use each of the above cleaning methods. Alternatively, it is also possible to perform rinsing with ultrapure water.

EXAMPLES

Example 1

An oxide film having a thickness of 200 nm was formed on the surface of a silicon substrate. The oxide film surface was observed with a surface foreign matter measuring apparatus to measure the number of particles (the amount of foreign matter) having a particle size of not less than 0.12 μm.

This silicon substrate was cleaned for 5 minutes using SC-1 cleaning solution (which had a component ratio of $NH_4OH$ (29 wt %): $H_2O_2$(30 wt %):$H_2O$=1:1:5 to 1:1:10). Thereafter, the resultant silicon substrate was rinsed with ultrapure water and then dried. The surface roughness (expressed in terms of RMS value @10 μm×10 μm) of the oxide film on the silicon substrate surface after being dried was measured.

The resultant silicon substrate having an oxide film thereon was loaded into a vacuum chamber of a hydrogen ion implantation apparatus after cleaning was completed.

Ion implantation by a hydrogen ion beam was performed under the condition of an applied voltage of 50 keV and dose amounts of $5.0\times10^{16}$/cm$^2$, while rotating the silicon substrate. Another silicon substrate was bonded to the silicon substrate on which hydrogen ion implantation was performed, and the number of voids when bonding was measured.

Next, the two bonded substrates were subjected to a heat treatment for 30 minutes at 500° C., thereby exfoliating the two sheets of silicon substrate from each other to obtain an SOI substrate. The number of blisterings of this SOI substrate was measured. These results are shown in Table 1. Note, in Table 1, the number of particles after cleaning (amount of foreign matter) is expressed in terms of the percentage of the number of particles after cleaning in the case in which the number of particles before cleaning is made to be 1. Moreover, each of the number of voids after cleaning and the number of blisterings after exfoliating (blistering fault percentage) is expressed in terms of the value based on the Comparative Example 1.

Example 2

An oxide film having a thickness of 200 nm was formed on the surface of a silicon substrate, similarly to Example 1. The oxide film surface was observed with a surface foreign matter measuring apparatus to measure the number of particles (the amount of foreign matter) having a particle size of not less than 0.12 μm.

This silicon substrate was cleaned for 5 minutes using SC-1 cleaning solution (which had a component ratio of $NH_4OH$ (29 wt %): $H_2O_2$(30 wt %):$H_2O$=1:1:5 to 1:1:10). Thereafter, the resultant silicon substrate was cleaned for 5 minutes using SC-2 cleaning solution (which had a component ratio of HCl (30 wt %): $H_2O_2$(30 wt %):$H_2O$=1:1:5 to 1:1:10). Thereafter, the resultant silicon substrate was rinsed with ultrapure water and then dried. The surface roughness (expressed in terms of RMS value @10 μm×10 μm) of the oxide film on the silicon substrate surface after being dried was measured.

Next, the resultant silicon substrate after being dried was subjected to the same treatment as in Example 1 to obtain an SOI substrate. Moreover, similarly to Example 1, each of the number of voids and the blistering fault percentage was measured. These measurement results are also shown in Table 1, using the same method of expressing as in Table 1.

Example 3

An oxide film having a thickness of 200 nm was formed on the surface of a silicon substrate, similarly to Example 1. The oxide film surface was observed with a surface foreign matter measuring apparatus to measure the number of particles (the amount of foreign matter) having a particle size of not less than 0.12 μm.

This silicon substrate was cleaned for 5 minutes using HF/O$_3$ cleaning solution (which was a solution in which 0.1% of O$_3$ was dissolved in a 0.1% HF aqueous solution). Thereafter, the resultant silicon substrate was rinsed with ultrapure water and then dried. The surface roughness (expressed in terms of RMS value @10 μm×10 μm) of the oxide film on the silicon substrate surface after being dried was measured.

Next, the resultant silicon substrate after being dried was subjected to the same treatment as in Example 1 to obtain an SOI substrate. Moreover, similarly to Example 1, each of the number of voids and the blistering fault percentage was measured. These measurement results are also shown in Table 1, using the same method of expressing as in Table 1.

Example 4

An oxide film having a thickness of 200 m was formed on the surface of a silicon substrate, similarly to Example 1. The oxide film surface was observed with a surface foreign matter measuring apparatus to measure the number of particles (the amount of foreign matter) having a particle size of not less than 0.12 μm.

This silicon substrate was cleaned for 5 minutes using HF cleaning solution (which was a 0.1% HF aqueous solution), and thereafter the resultant silicon substrate was cleaned for 5 minutes using O$_3$ cleaning solution (which was a solution in which 0.1% O$_3$ was dissolved in ultrapure water). Thereafter, the resultant silicon substrate was rinsed with ultrapure water and then dried. The surface roughness (expressed in terms of RMS value @10 μm×10 μm) of the oxide film on the silicon substrate surface after being dried was measured.

Next, the resultant silicon substrate after being dried was subjected to the same treatment as in Example 1 to obtain an SOI substrate. Moreover, similarly to Example 1, each of the number of voids and the blistering fault percentage was measured. These measurement results are also shown in Table 1, using the same method of expressing as in Table 1.

Example 5

An oxide film having a thickness of 200 nm was formed on the surface of a silicon substrate, similarly to Example 1. The oxide film surface was observed with a surface foreign matter measuring apparatus to measure the number of particles (the amount of foreign matter) having a particle size of not less than 0.12 μm.

This silicon substrate was cleaned for 5 minutes using SC-1 cleaning solution (which had a component ratio of NH$_4$OH (29 wt %): H$_2$O$_2$(30 wt %):H$_2$O=1:1:5 to 1:1:10). Thereafter, the resultant silicon substrate was rinsed with ultrapure water and then the resultant silicon substrate was cleaned for 5 minutes using the same SC-1 cleaning solution again, and thereafter rinsed with ultrapure water. After performing the rinsing twice with ultrapure water, the resultant silicon substrate was dried, and the surface roughness (expressed in terms of RMS value @10 μm×10 μm) of the oxide film on the silicon substrate surface after being dried was measured.

Next, the resultant silicon substrate after being dried was subjected to the same treatment as in Example 1 to obtain an SOI substrate. Moreover, similarly to Example 1, each of the number of voids and the blistering fault percentage was measured. These measurement results are also shown in Table 1, using the same method of expressing as in Table 1.

TABLE 1

|  | Number of particles before cleaning | Number of particles after cleaning | Surface roughness (nm) | Number of voids | Blistering fault percentage |
|---|---|---|---|---|---|
| Example 1 | 1.0 | 0.1 | 0.08 | 0.2 | 0.3 |
| Example 2 | 1.0 | 0.2 | 0.08 | 0.2 | 0.3 |
| Example 3 | 1.0 | 0.1 | 0.09 | 0.3 | 0.3 |
| Example 4 | 1.0 | 0.2 | 0.09 | 0.1 | 0.3 |
| Example 5 | 1.0 | 0.05 | 0.09 | 0.2 | 0.4 |
| Comparative Example 1 (Standard) | 1.0 | — | 0.08 | 1.0 | 1.0 |
| Comparative Example 2 | 1.0 | 0.5 | 0.11 | 4.0 | 5.0 |

Comparative Example 1

An oxide film having a thickness of 200 nm was formed on the surface of a silicon substrate. The oxide film surface was observed with a surface foreign matter measuring apparatus to measure the number of particles (the amount of foreign matter) having a particle size of not less than 0.12 μm.

Without cleaning the resultant silicon substrate, the surface roughness (expressed in terms of RMS value @10 μm×10 μm) of the oxide film on the surface thereof was measured.

The resultant silicon substrate having an oxide film thereon was loaded into a vacuum chamber of a hydrogen ion implantation apparatus. Ion implantation by a hydrogen ion beam was performed under the condition of an applied voltage of 50 keV and dose amount of $5.0 \times 10^{16}/cm^2$, while rotating the silicon substrate. Another silicon substrate was bonded to the silicon substrate on which hydrogen ion implantation was performed, and the number of voids when bonding was measured.

Next, the two bonded substrates were subjected to a heat treatment for 30 minutes at 500° C., thereby exfoliating the two sheets of silicon substrate from each other to obtain an SOI substrate. The number of blisterings of this SOI substrate was measured. These results are shown in Table 1. Note, in Table 1, the number of particles after cleaning (amount of foreign matter) is expressed in terms of the percentage of the number of particles after cleaning in the case in which the number of particles before cleaning is made to be 1. Moreover, each of the number of voids after cleaning and the number of blisterings after exfoliating (blistering fault percentage) was regarded as 1, which served as the standard for all measured values.

Comparative Example 2

An oxide film having a thickness of 200 nm was formed on the surface of a silicon substrate. The oxide film surface was observed with a surface foreign matter measuring apparatus to measure the number of particles (the amount of foreign matter) having a particle size of not less than 0.12 μm.

This silicon substrate was cleaned for 5 minutes using HF cleaning solution (which was a 0.1% HF aqueous solution). Thereafter the resultant silicon substrate was rinsed with ultrapure water and then dried. The surface roughness (expressed in terms of RMS value @10 μm×10 μm) of the oxide film on the silicon substrate surface after being dried was measured.

Next, the resultant silicon substrate after being dried was subjected to the same treatment as in Example 1 to obtain an SOI substrate. Moreover, similarly to Example 1, each of the number of voids and the blistering fault percentage was measured. These measurement results are also shown in Table 1, using the same method of expressing as in Table 1.

As explained in the above, in accordance with the present invention, particles which had adhered to the silicon substrate surface before performing hydrogen ion implantation are cleaned to be removed completely therefrom, and hence there is no concern that particles will be adhered firmly, even if hydrogen ion implantation is performed, and as a result, it becomes possible to prevent generation of voids. Moreover, in accordance with the present invention, hydrogen ion implantation is performed after performing cleaning continuously, and hence it is only necessary to replace the position of a cleaning bath in the production line, without making the process complicated, thereby increasing productivity and the manufacturing yield.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A process for cleaning a bonded SOI silicon substrate using hydrogen ion implantation, comprising:
   cleaning a silicon substrate, and then
   performing hydrogen ion implantation on said silicon substrate,
   wherein the cleaning of the silicon substrate includes a plurality of cleaning steps, and the final cleaning step is a step of cleaning the silicon substrate using $O_3$.

2. The process for cleaning a bonded SOI silicon substrate as set forth in claim 1, wherein said cleaning is performed two or more times, while changing cleaning conditions.

3. The process for cleaning a bonded SOI substrate as set forth in claim 1 or 2, wherein said cleaning is one or more of a combination selected from the group consisting of SC-1 cleaning, SC-1 cleaning + SC-2 cleaning, HF/O3 cleaning, and HF cleaning+O3 cleaning.

4. The process for cleaning a. bonded SOI silicon substrate as set forth in claim 1 or 2, wherein said cleaning is performed again after performing said hydrogen ion implantation.

5. The process for cleaning a bonded SOI silicon substrate as set forth in claim 4, wherein said cleaning performed after performing, said hydrogen ion implantation is a rinsing with ultra-pure water.

6. The process for cleaning a bonded SOI silicon substrate as set forth in claim 1 or 2, wherein said bonded SOI silicon substrate after said cleaning has a surface roughness expressed in terms of RMS value of not more than 0.1 nm (10 μm×10 μm

* * * * *